United States Patent
Lopez et al.

(10) Patent No.: US 7,722,361 B2
(45) Date of Patent: *May 25, 2010

(54) TEST SOCKET

(76) Inventors: Jose E. Lopez, 665 Santa Paula Ave., Sunnyvale, CA (US) 94044; Dennis B. Shell, 7243 40th St. West, Webster, MN (US) 55088; Mathew L. Gilk, 70537 Toledo Dr. North, Minneapolis, MN (US) 55443-5424

( * ) Notice: Subject to any disclaimer, the term of this patent is extended or adjusted under 35 U.S.C. 154(b) by 0 days.

This patent is subject to a terminal disclaimer.

(21) Appl. No.: 12/264,008

(22) Filed: Nov. 3, 2008

(65) Prior Publication Data

US 2009/0053912 A1    Feb. 26, 2009

Related U.S. Application Data

(63) Continuation of application No. 11/482,644, filed on Jul. 7, 2006, now Pat. No. 7,445,465.

(60) Provisional application No. 60/697,693, filed on Jul. 8, 2005, provisional application No. 60/776,654, filed on Feb. 24, 2006, provisional application No. 60/697,721, filed on Jul. 8, 2005.

(51) Int. Cl.
*H01R 12/00* (2006.01)
(52) U.S. Cl. .................................................. 439/72
(58) Field of Classification Search .................. 439/72, 439/70, 71, 73, 754
See application file for complete search history.

(56) References Cited

U.S. PATENT DOCUMENTS

| | | | |
|---|---|---|---|
| 4,980,245 A | 12/1990 | Marino | |
| 5,069,629 A | 12/1991 | Johnson | |
| 5,189,363 A | 2/1993 | Bregman et al. | |
| 5,594,355 A * | 1/1997 | Ludwig | 324/755 |
| 5,609,489 A | 3/1997 | Bickford et al. | |
| 5,634,801 A | 6/1997 | Johnson | |
| 6,231,353 B1 | 5/2001 | Rathburn | |
| 6,244,874 B1 | 6/2001 | Tan | |
| 6,572,388 B2 * | 6/2003 | Lee | 439/71 |
| 6,794,890 B1 | 9/2004 | Tokumo | |
| 6,854,981 B2 | 2/2005 | Nelson | |
| 2002/0033522 A1 | 3/2002 | Nagamine | |
| 2003/0068908 A1 * | 4/2003 | Brandt et al. | 439/71 |
| 2004/0067665 A1 * | 4/2004 | Nakano | 439/70 |
| 2004/0217771 A1 | 11/2004 | Leong | |
| 2004/0248448 A1 * | 12/2004 | Gilk | 439/264 |

FOREIGN PATENT DOCUMENTS

EP    1 482 595 A    12/2004

* cited by examiner

*Primary Examiner*—T C Patel
*Assistant Examiner*—Vladimir Imas
(74) *Attorney, Agent, or Firm*—Nawrocki, Rooney & Sivertson, P.A.

(57) ABSTRACT

An improved test socket for use in testing integrated circuits. The test socket includes a housing having one or more slots formed therein. Contacts can be received within respective slots and maintained therein with rear ends of the contacts in engagement with traces on a load board. Mounting is accomplished by means of a pair of elastomers, and the elastomers maintain each contact such that, when the front end of a contact is engaged by the lead or pad of the device to be tested and urged into its corresponding slot, an arcuate surface at a rear end of each contact rolls across its corresponding trace with virtually no translational or rotational sliding.

6 Claims, 2 Drawing Sheets

TEST SOCKET

CROSS-REFERENCE TO RELATED APPLICATIONS

This is a continuation of application Ser. No. 11/482,644 filed on Jul. 7, 2006 now U.S. Pat. No. 7,445,465, which claims priority of the following provisional applications filed under 35 U.S.C. §111(a) claiming priority, under 35 U.S.C. §119(e)(1): provisional application Ser. No. 60/697,693, previously filed Jul. 8, 2005, under 35 U.S.C. §111(b); provisional application Ser. No. 60/776,654, previously filed on Feb. 24, 2006, under 35 U.S.C. §111(b); and provisional application Ser. No. 60/697,721, previously filed on Jul. 8, 2005, under 35 U.S.C. §111(b).

TECHNICAL FIELD

The present invention deals with electronic component testing technologies. More specifically, however, the invention deals with test sockets which employ contacts for testing an electronic component. A test socket includes contacts which interconnect and provide an electronic path between a lead or pad of the electronic component to be tested and a corresponding trace on a load board. The invention focuses upon control and regulation of forces applied to a device lead or pad and a load board trace by a corresponding contact of the test socket.

BACKGROUND OF THE INVENTION

Integrated circuit device testing is a procedure which has been observed for many years in order to obtain as high a degree of quality control as possible for electronic devices. A tester typically includes a plurality of conductive traces formed on a load board associated with the tester apparatus. It is necessary to interconnect a lead, of a leaded device, or a pad, of a non-leaded device, to a corresponding trace on the load board in order to effectuate testing. A test socket having a plurality of contacts is interposed between the device under test and the load board in order to effectuate interconnection. One contact engages, at a front end, the lead or pad of a device under test with its corresponding trace on the load board.

Over the years, shape and construction of such contacts have evolved in response to the construction of test sockets, load boards, and architecture of devices to be tested. Formerly, it was considered necessary to have a wiping action at the various locations of engagement at the contact ends in order to provide a good transmission path. As technology has progressed, however, it has become apparent that less wiping action is necessary to maintain a good transmission path than what was formerly believed. Furthermore, it has become apparent that excessive wiping action damages component parts at the various points of engagement and significantly decreases the life of the test socket and tester load board. Consequently, various attempts have been made to minimize abrading of one surface relative to another. The current state of the art, however, has been unable to define a construction adequate to both maximize efficiency of the test socket and minimize abrasion and consequent deterioration of component parts.

It is to these problems and dictates of the prior art that the present invention is directed. Its advantages will become more apparent with reference to the Summary of the Invention, Detailed Description of the Invention, appended claims and accompanying drawing figures.

SUMMARY OF THE INVENTION

The present invention is an improved test socket. It includes a housing which has a first surface that is placed into engagement with a surface of a tester load board. The housing has a second surface which is generally parallel to, and spaced from, the housing first surface. The second surface of the housing faces in a direction opposite that in which the first surface faces. At least one slot, extending through the housing between the first and second surfaces thereof, is formed in the housing. A contact is received in a corresponding slot. Such a contact has a front end which normally extends beyond the second surface of the housing to be engaged by a corresponding lead or pad of a device to be tested. The contact further has a rear end which defines an arcuate surface, the arcuate surface engaging a corresponding trace formed on the surface of the tester load board. The contact is elastomerically mounted in its slot such that, when the front end of the contact is engaged by the lead or the pad of the device to be tested and urged into its slot, the arcuate surface of the contact rolls across its corresponding trace on the surface of the tester load board with virtually no translational or rotational sliding. Abrasion between the contact and the load board is, thereby, substantially eliminated.

It is envisioned that the rear end of the contact, in addition to defining the arcuate surface in engagement with the load board, also defines a gradually arcing surface which is angularly spaced from the arcuate surface thereof. The housing, in this embodiment, defines a wall within the slot. The wall is engaged by the gradually arcing surface of the rear end of the contact, and the spatial relationship between the gradually arcing surface and the wall is such that, as the front end of the contact is engaged by the lead or pad of the device to be tested and urged into the corresponding slot, the gradually arcing surface moves along the wall and causes the arcuate surface of the contact to roll across its corresponding trace. It is envisioned that the wall defined by the housing would be angularly spaced at an acute angle relative to the first surface of the housing. This would enable the arcuate surface of the contact to roll across the trace of the tester load board with virtually no translational or rotational sliding.

A preferred embodiment of the invention employs a pair of elastomers, crossing perpendicularly across the slots, to effect the elastomeric mounting of the contacts. A front elastomer is positioned in a channel between the surface of the tester load board and the contacts. The front elastomer is pre-compressed in view of the fact that a shoulder defined by the housing can be employed to engage the contacts and limit the distance they extend beyond the second surface of the housing. Pre-compression is, thereby, accomplished by the contacts and the load board sandwiching the front elastomer therebetween. The front elastomer becomes further compressed by the contacts as they are engaged by the leads or pads of the device to be tested and urged into their respective slots.

The rear elastomer pre-loads the rear end of the contact. It thereby maintains contact between the rear end of each contact against its corresponding trace on the surface of the tester load board.

The present invention can employ contacts made of precious metals. Such contacts extend load board life. A Neyoro G contact is a solid gold alloy contact without any plating. While it has been found that such a material extends the life of the contact, it also extends load board life. By using Neyoro G material for the contacts, load board life can, it has been found, be at least doubled over load board life in mechanisms known in the prior art.

The present invention is thus an improved test socket which addresses the dictates of the prior art and solves problems thereof. More specific features and advantages obtained in view of those features will become apparent with reference to the Detailed Description of the Invention, appended claims and accompanying drawing figures.

DETAILED DESCRIPTION OF THE INVENTION

Figure 1:
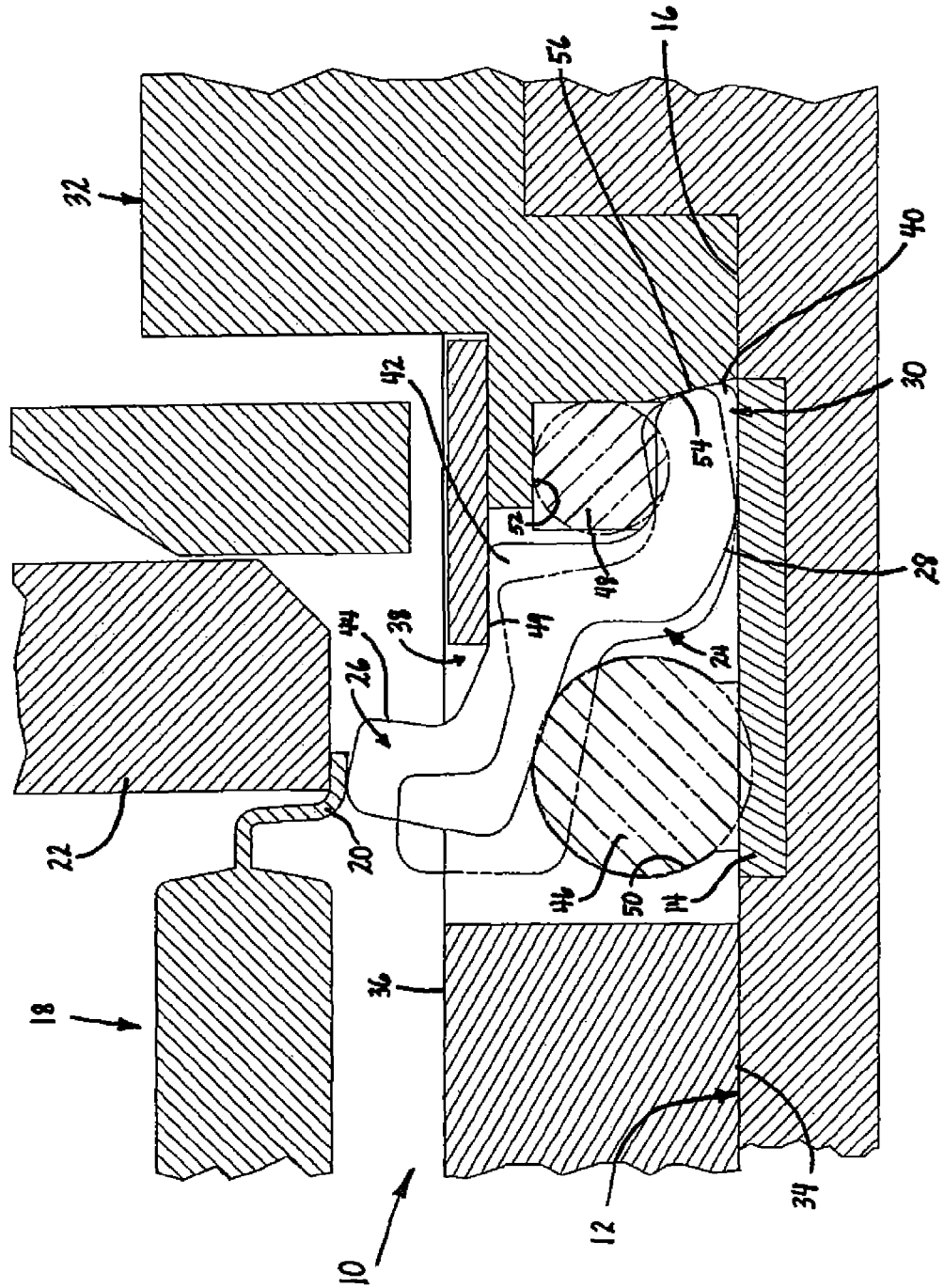
FIG. 1 is a sectional view of a test socket in accordance with the present invention showing contact and elastomer response to engagement of a contact by a lead of a device under test.

Referring now to the drawing figures, wherein like reference numerals denote like elements throughout the several views, FIG. 1 illustrates a test socket 10 in accordance with the present invention. The test socket 10 is intended for use with a tester typically employed for ascertaining quality of integrated circuit devices used in electronic appliances. The tester interfaces with a tester load board 12 which has electrically conductive traces 14 formed on a surface 16 thereof to enable electronic communication between the tester and an integrated circuit device 18 to be tested. That is, electrical signals are transmitted between the device under test 18 and the test apparatus through the test socket 10.

FIG. 1 illustrates a DUT package which is provided with a plurality of leads 20, only one of which is shown. FIG. 1 illustrates only a portion of the device under test 18, but it will be understood that substantially identical leads extend along both of opposite sides of the device package 18.

FIG. 1 further illustrates a lead backer which, when the device under test 18 is brought into engagement with its leads 20 in contact with corresponding contacts 24 of the test socket 10, deters bending of the leads 20. Downward pressure is brought to bear upon the device 18 under test by a plunger mechanism (not shown). The plunger depresses, when testing is to be conducted, the contacts 24 to overcome an upward bias imparted by the elastomerically-mounted contacts 24. FIG. 1 illustrates the normal position of the contacts 24 prior to a device under test 18 being brought into engagement with the contacts 24. That figure also illustrates, in phantom, a position of the contact when the plunger has depressed the device under test to its test position. Typically, the distance of travel of the front end 26 of a contact 24 along an axis along which the plunger moves is on the order of 0.3 mm. It will be understood that, in view of the construction of the contacts 24 as will be discussed hereinafter, an arcuate surface 28 at a rear end 30 of the contact 24 on a lower edge thereof will roll across a corresponding trace 14 on the load board 12 with virtually no translational or rotational sliding of that surface along the trace 14. Optimally, arcuate surface 28 would have as great a radius of curvature as possible to limit the impact brought to bear upon trace 14. Further, it has been found that, in view of the construction of the contact 24, translational sliding of the front end 26 of the contact 24 along the lead 20 of the device under test 18 to which the contact corresponds will be adequate to effect significant scrub on the front end of the contact but minimal scrub on a lead 20 of the device 18. For example, in one embodiment of the invention, the translational sliding is on an order of 0.041 mm on the device 18.

The test socket 10 includes a housing 32 which has a first surface 34 generally in engagement with the surface 16 of the tester load board 12 on which the traces 14 are formed. The housing 32 has a second surface 36 which is generally parallel to, and spaced from, the first surface thereof. The second surface 36 of the housing 32 faces oppositely from the first surface 34. As previously discussed, the housing 32 carries a plurality of contacts 24. A plurality of slots 38 are provided, each slot to receive a single one of the contacts 24.

Figure 2:
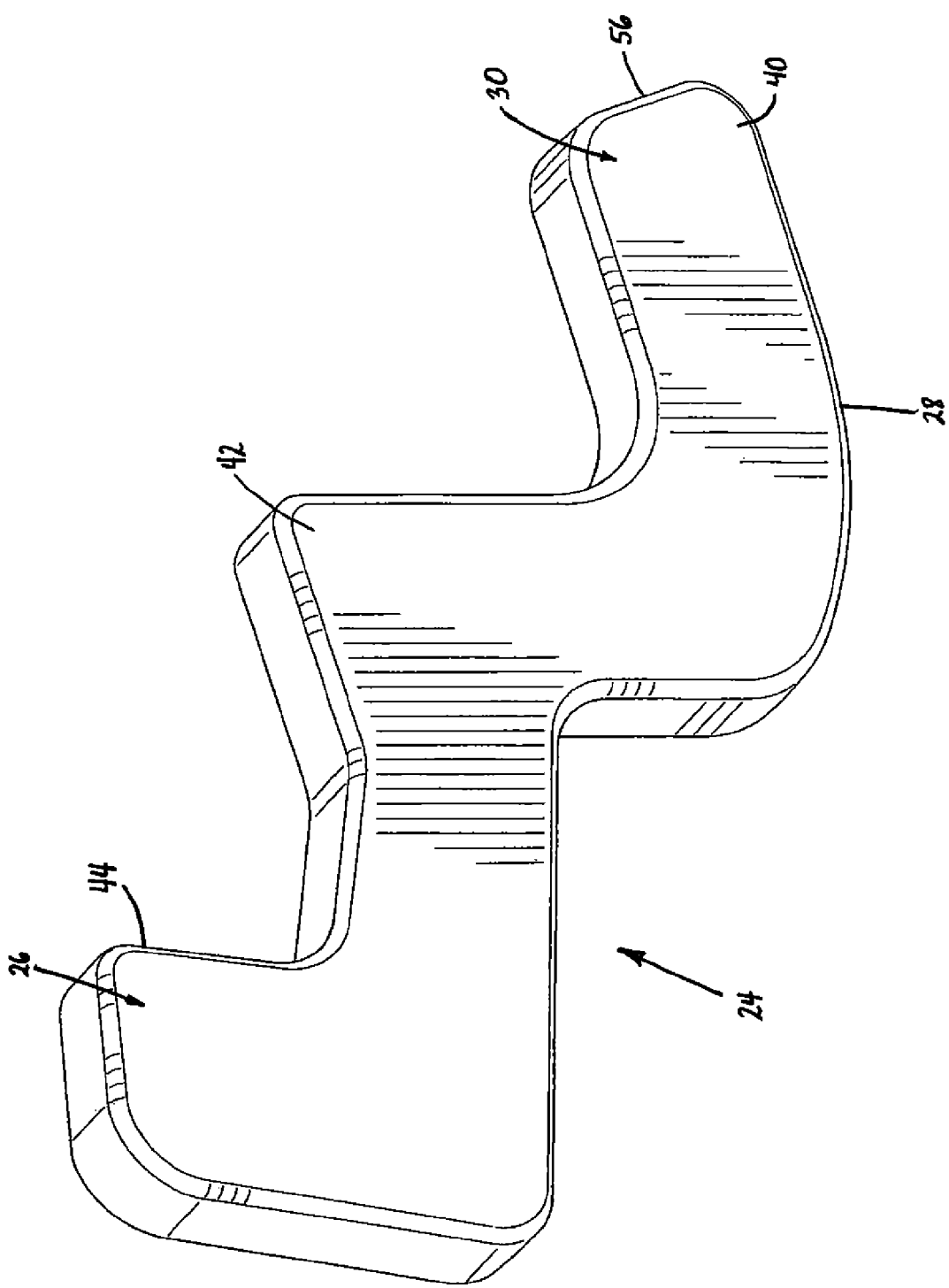
FIG. 2 is a perspective view of a contact for use in the present invention.

FIG. 2 illustrates, in perspective, an individual contact in accordance with the present invention. The contact 24 includes first, second and third protrusions 40, 42, 44. The first protrusion 40 is defined by the rear end 30 of the contact 24 which engages the trace 14 of the load board 12. The third protrusion 44 is defined by the front end 26 of the contact 24 which is engaged by a lead 20 or pad of the device under test 18. The second protrusion 42 serves to engage, when mounted by a plurality of elastomers 46, 48, as will be discussed hereinafter, a shoulder 49 defined by the housing 32. Engagement of the shoulder 49 by the second protrusion 42 serves to limit the degree of upward movement of the contact 24 and the distance the front end 26 of the contact 24 will extend beyond the second surface 36 of the housing 32 when the contact 24 is not engaged by a device to be tested.

Referring again to FIG. 1, the test socket 10 has a pair of channels 50, 52 which extend along axes generally transverse to planes defined by the slots 38 formed in the housing 32. These channels 50, 52 are intended to receive elastomers 46, 48 which serve to mount the contacts 24 in their slots 38. FIG. 1 shows a generally circular channel 50 receiving a larger, front elastomer 46, and a rectangular channel 52 receiving a smaller, rear elastomer 48. The rear elastomer 48 is preloaded and, because of the arcuate surface 28 of the rear end 30 of the contact 24 being in engagement with the load board 12, will engage an upper edge of the rear end 30 of the contact 24 at a location to urge the front end 26 of the contact 24 upwardly. Similarly, the front elastomer 46 is under compression and also serves to urge the contact 24 upward and bias it to a point of initial contact by a lead 24 or pad of an integrated circuit device 18 to be tested.

As previously alluded to, the arcuate surface 28 in engagement with the trace 14 on the load board 12 has no, if any, appreciable translational or rotational sliding along the trace 14 of the load board 12. This is so because of an angled wall 54 defined within the housing 32 proximate its first surface 34 near the end of a slot 38. The rear end 30 of the contact 24, in addition to defining the arcuate surface 28, also has a gradually arcing surface 56 at an edge of the rear end 30 of the contact 24 which engages this angled wall 54 defined by the housing 32. Disposition of a contact 24 is such that the gradually arcing surface 56 will interact with the angled wall 54 defined by the end of the slot 38 so that the point of contact of the arcuate surface 28, while it will move across the load board trace 14, will not slide across that trace 14. The motion will be virtually totally a rolling action (that is, one in which the relative movement across the trace will be as a wheel rolling on a surface without any slippage). This will result from the gradually arcing surface 56, because of its contour, permitting the arcuate surface 28 of the rear end 30 of the contact 24 to roll without translational sliding as engagement of the gradually arcing surface 56 is maintained in contact with the angled wall 54. When the device under test 18 is withdrawn, rolling in a reverse direction will occur.

As previously discussed, as withdrawal of the device occurs, the second projection 42 will engage the shoulder 49 defined by the housing 32 in order to limit upward movement of the contacts 24.

It will also be noted that the point of application of force by a device under test 18 is spaced laterally a relatively significant distance from the point of engagement of the rear end 30 of the contact 24 with the trace 14 on the load board 12. This will augment the beneficial advantage achieved by the rolling action (that is, minimization of likelihood of damage to the load board).

Further, contacts made of precious metals can be employed in the present invention. Such contacts tend to extend load board life also. A Neyoro G contact, which is a solid gold alloy contact not having any plating, is envisioned as being used. Such a material, it has been found, not only extends the life of the contact. It also, however, extends load board life by minimizing damage to the traces thereon. It has been found that load board life can be at least doubled over mechanisms constructed as known in the prior art.

It will be understood that this disclosure, in many respects, is only illustrative. Changes may be made in details, particularly in matters of shape, size, material, and arrangement of parts without exceeding the scope of the invention. Accordingly, the scope of the invention is as defined in the language of the appended claims.

What is claimed is:

1. A test socket, comprising:
    a housing having a first surface generally in engagement with a surface of a tester load board, said housing further having a second surface, generally parallel to, spaced from, and facing oppositely from said first surface, and at least one slot formed in said housing extending through said housing between said first surface and said second surface;
    a contact received in a corresponding slot and having a front end extending beyond said second surface for engagement by a corresponding lead or pad of a device to be tested, and having a rear end defining an arcuate surface in engagement with a corresponding trace on said surface of the tester load board, and defining a gradually arcing surface, angularly spaced from said arcuate surface, and said housing defining, within the slot, a wall, engaged by said gradually arcing surface of said rear end of said contact, such that, as said front end of said contact is engaged by the lead or pad of the device to be tested and urged into the corresponding slot, said gradually arcing surface of said contact moves along said wall and causes said arcuate surface to roll across the corresponding trace; and
    means for elastomerically mounting said contact in said corresponding slot, wherein, when said front end of said contact is engaged by the lead or pad of the device to be tested and urged into the corresponding slot, said arcuate surface rolls across said corresponding trace with virtually no translational or rotational sliding.

2. A test socket in accordance with claim 1, wherein said wall is angularly spaced at an arcuate angle relative to said first surface of said housing.

3. A test socket in accordance with claim 1 wherein said means for elastomerically mounting said contact comprises a front elastomer precompressed by the contact and compressed further by the contact as said front end of said contact is engaged by the lead or pad of the device to be tested and urged into the slot.

4. A test socket in accordance with claim 3 wherein said means for elastomerically mounting said contact further comprises a rear elastomer that preloads the rear end of the contact against a corresponding trace on the surface of the tester load board.

5. A test socket in accordance with claim 4 further comprising a shoulder defined by said housing for engaging the contact and limiting the distance the contact extends beyond said second surface of said housing.

6. A test socket in accordance with claim 1 wherein said contacts are made of Neyoro G.

* * * * *